United States Patent [19]

Shor et al.

[11] Patent Number: 5,751,178

[45] Date of Patent: May 12, 1998

[54] APPARATUS AND METHOD FOR SHIFTING SIGNAL LEVELS

[75] Inventors: Joseph Shor, Raanana; Eytan Engel, Givat-Tal; Natan Baron, Oranit, all of Israel

[73] Assignee: Motorola, Inc., Schaumburg, Ill.

[21] Appl. No.: 767,094

[22] Filed: Dec. 5, 1996

[51] Int. Cl.[6] .................................................. H03K 5/153
[52] U.S. Cl. .............................. 327/333; 327/54; 327/55
[58] Field of Search .............................. 327/333, 54, 55, 327/57

[56] References Cited

U.S. PATENT DOCUMENTS

| 4,434,381 | 2/1984 | Stewart | 307/530 |
|---|---|---|---|
| 4,859,871 | 8/1989 | Kobayashi et al. | 307/264 |
| 4,868,415 | 9/1989 | Dunn | 307/264 |
| 5,059,829 | 10/1991 | Flannagan et al. | |
| 5,341,047 | 8/1994 | Rosenthal | 307/475 |
| 5,396,108 | 3/1995 | McClure | |
| 5,416,368 | 5/1995 | Sugibayashi | |
| 5,469,080 | 11/1995 | Son | |
| 5,473,263 | 12/1995 | Mahmood | |
| 5,506,524 | 4/1996 | Lin | 327/57 |
| 5,528,173 | 6/1996 | Merritt et al. | |
| 5,541,546 | 7/1996 | Okumura | 327/333 |
| 5,565,715 | 10/1996 | Doluca | 307/130 |

FOREIGN PATENT DOCUMENTS 7221626  8/1995  Japan.

OTHER PUBLICATIONS 7-221626 Kokai, published Aug. 18, 1995, filed Jan. 27, 1994. *Assuming That AR document is AM Document.

Primary Examiner—Timothy P. Callahan
Assistant Examiner—An T. Luu
Attorney, Agent, or Firm—Robert M. Handy

[57] ABSTRACT

The electronic circuit (100) of the invention receives first signals DATA (170) having logical "1" at high (VCCH) or low (VCCL) levels and logical "0" at reference level (ZERO) and generates second signals OUT (186) between high level (VCCH) and reference level (ZERO) without changing the information. The circuit comprises a first switch (161) and a second switch (161) serially coupled together to a common output node (103). The first switch (162) is controlled by a control signal (CTRL) derived from DATA, OUT, or optionally from a clock signal CLK. The first switch (161) is switched off before the second switch (162) is switched off. Contention (conducting at the same time) is thereby avoided and the first switch (161) and the second switch (162) can be implemented by substantially equal-sized components.

17 Claims, 8 Drawing Sheets

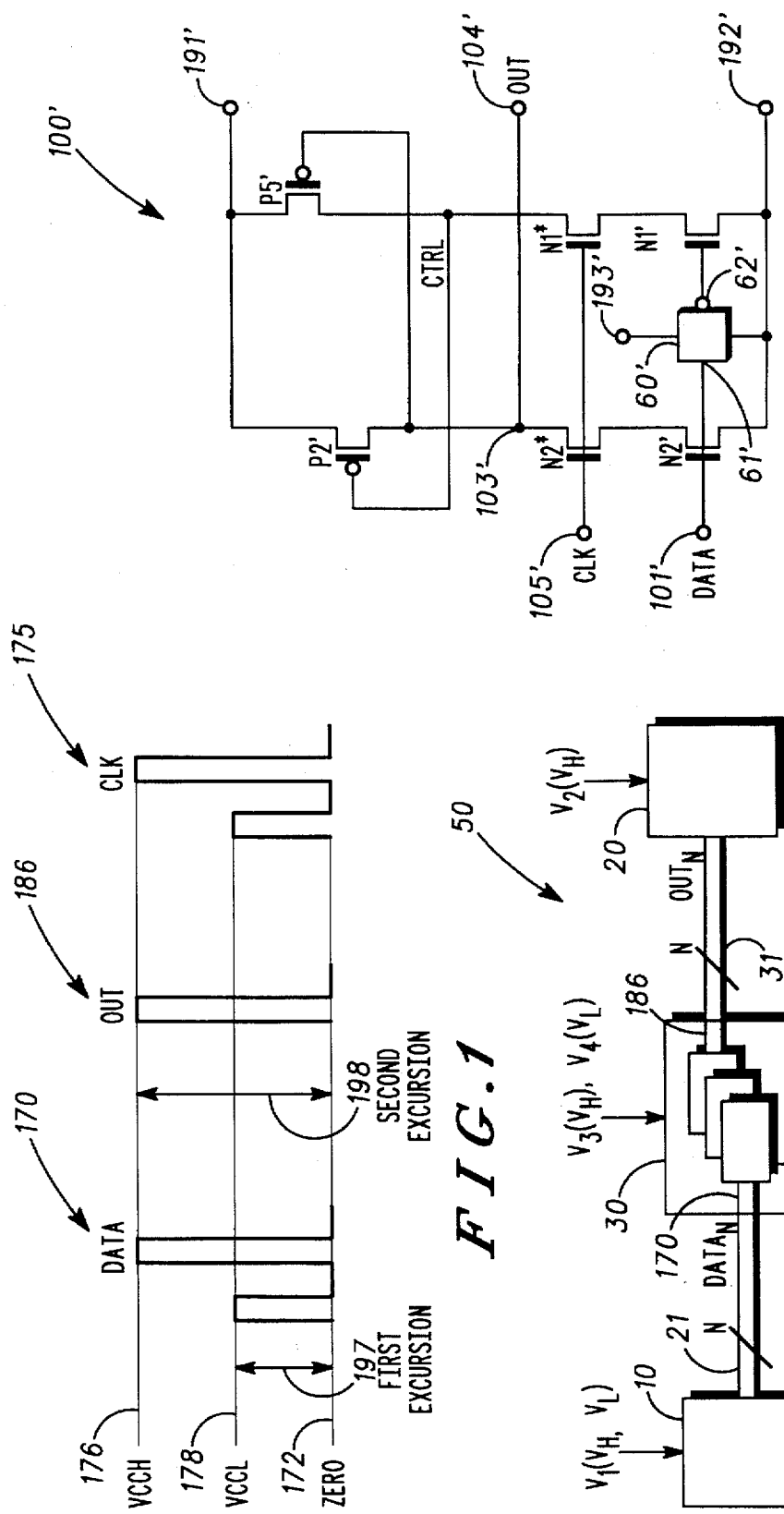

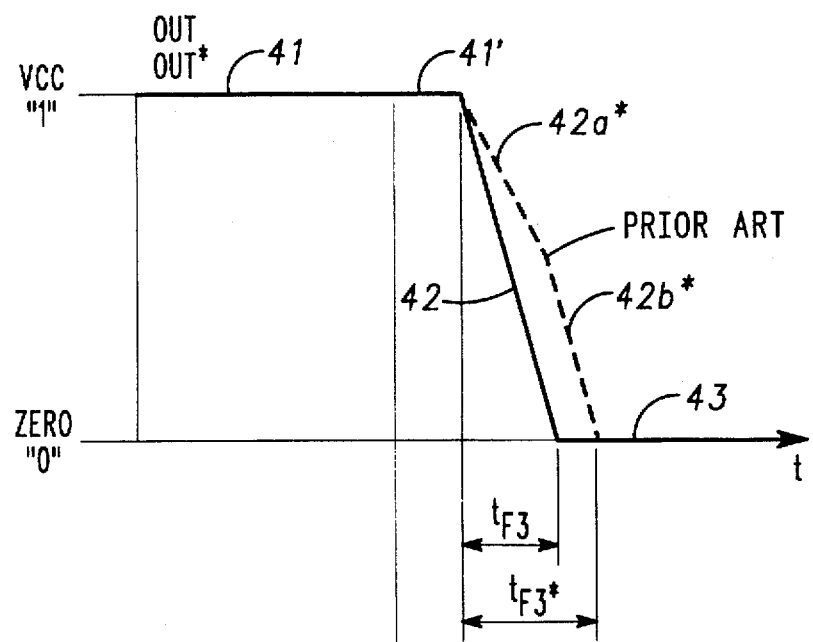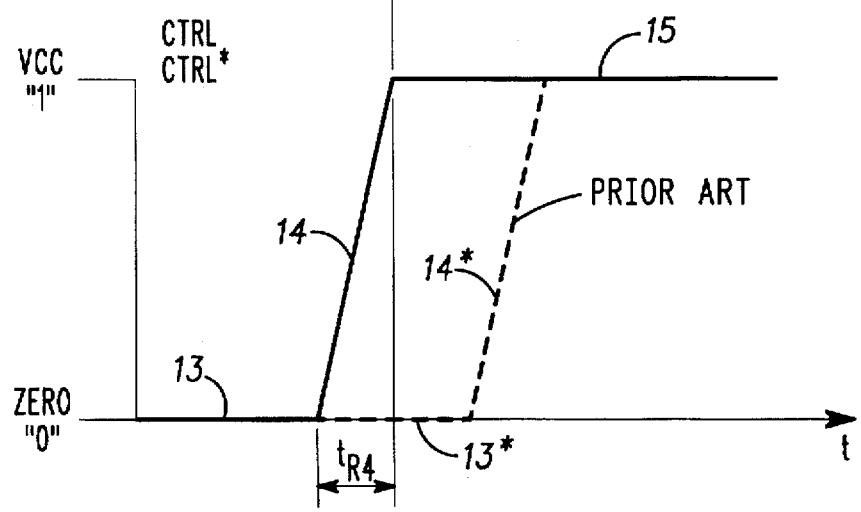
*FIG.6*

5,751,178

1

APPARATUS AND METHOD FOR SHIFTING SIGNAL LEVELS

FIELD OF THE INVENTION

This invention generally relates to electronic circuits, and more particularly, to signal level shifting circuits. The invention also relates to a method of shifting signal levels.

BACKGROUND OF THE INVENTION

Low-power circuit techniques are becoming increasingly important in electronic applications, such as, for example, in portable data processing devices. Such devices can have a core data processor and an input-output interface. The core operates alternately at a low supply voltage (e.g., 3.3 volts) or at a high supply voltage (e.g., 5 volts). The interface operates at a high supply voltage (e.g., 5 volts). The core operates at the low supply voltage during low speed periods (e.g., in sleep mode) and operates at the high supply voltage when the device requires full speed. However, the logic signals generated by the core at low supply voltage are at a low level which is too small to control the interface properly. For example, when the interface comprises a P-channel field effect transistor with the source coupled to the high supply voltage, then a high gate voltage is required to switch off that transistor. A signal level shifting circuit is required.

Two primary objectives of any signal level shifting circuits are: (a) the reduction of time required to shift an input signal and (b) the power requirements to complete the shifting operation. The inherent delay of a shifting circuit is critical. With the integration of low-voltage circuits and high-voltage circuits into single chips, there is a need for providing a fast shifting circuit which can be implemented into such chips. Shortening the delay by several 100 pico seconds is considered significant. While down-converting high signal levels to low signal levels is a task which can easily be solved in the art, up-converting low signal levels to high signal levels requires special circuitry.

The technical problem to be solved is explained in reference to FIGS. 1–2. FIG. 1 is a simplified signal diagram of the signals. The signals have a first logical state (e.g., logical "1") and a second logical state (e.g., logical "0"). First signal 170 (hereinafter DATA) has logical "1" at first signal level 176 (hereinafter VCCH) and has logical "0" at second signal level 172 (hereinafter ZERO). DATA can also have logical "1" at third signal level 178 (hereinafter VCCL). It is convenient to assume that the voltages of the levels relate to as |VCCH|>|VCCL|>|ZERO|. |VCCH| and |VCCL| correspond to the above mentioned terms 'high signal level' and 'low signal level', respectively. |ZERO| is a reference level.

DATA can be provided by, e.g., the above mentioned core operating at the low supply voltage. DATA alternates by at least a first excursion 197 whose magnitude is the difference between |VCCL| and |ZERO|. Second signal 186 (hereinafter OUT) has logical "1" at |VCCH| (first signal level 176) and logical "0" at |ZERO| (second signal level 172). OUT can be supplied to, e.g., the above mentioned input-output interface. OUT alternates by a second excursion 198 which is the difference between |VCCH| and |ZERO|. The magnitude of second excursion 198 is larger than the magnitude of first excursion 197.

Third signal 175 (hereinafter CLK) has logical "1" at |VCCH| (176) or at |VCCL| (178) and logical "0" at |ZERO| (172). In further explanations where a distinction between VCCH and VCCL is not required, VCCH and VCCL are collectively referred to as VCC. For convenience it is assumed that ZERO is substantially equal for DATA, OUT

2 and CLK. A person of skill in the art will understand that there can be different reference levels ZERO. |VCCL| has a voltage between, for example, 1.8 volts and 2.5 volts. |VCCH| has a voltage of, e.g., between 2.7 volts and 3.6 volts. |ZERO| has a voltage of e.g., 0 volts. It is assumed that the difference |VCCH-VCCL| is greater than the threshold voltage $V_t$ of a P-channel field effect transistor. In the following, underlined acronyms (e.g., DATA, CLK) stand for inverted signals.

FIG. 2 is a simplified circuit diagram of first prior art level shifting circuit 100' (hereinafter first prior art circuit 100' or circuit 100'). In FIG. 2, reference numbers for components are dashed to indicate prior art. Circuit 100' receives DATA at input terminal 101' and CLK at clock terminal 105'. Circuit 100' converts DATA to OUT available at output terminal 104' (output node 103'). Circuit 100' has first reference line 191' for receiving first supply voltage $V_3$ (substantially equal to VCCH of, e.g., 3.6 volts), second reference line 192' at a reference voltage $V_R$ (e.g., ground 0 volts), and third reference line 193' at second supply voltage $V_4$ (e.g., 2.5 volts).

P-channel field effect transistor P2' (P-FET P2') is a first switch controlled by an intermediate signal CTRL. P-FET P2' is not directly controlled by DATA. DATA at VCCL could not switch off P-FET P2' properly because of |VCCH-VCCL|>$V_t$. N-channel field effect transistor N2' (N-FET N2) is a second switch controlled by DATA. The switches pull output node 103' carrying OUT to first reference line 191' (at e.g., VCCH=$V_3$) or to second reference line 192' (at e.g., ZERO=0 volts). When switched on, the first switch pulls output node 103 to first reference line 191'. When switched on, the second switch pulls output node 103' to second reference line 192'.

As used herein, the terms 'switch on' and 'switched on' are intended to mean that a switch (e.g., a transistor) is being made conductive or is already conductive, respectively.

The opposite terms 'switch off' and 'being switched off' indicate a non-conductive switch or a switch with decreasing conductivity. The verbs 'switch on/off' and 'turn on/off' will be used as synonyms and can be exchanged. When DATA is changing, one switch is partly switched on or fully switched on before or during the time when the other switch is switched off. In other words, both switches are at least partly conducting at the same time. This behavior is referred to as 'contention'. Contention is an unwanted limitation of any level shifting circuit. Contention determines among other things: (a) the minimum shifting time and (b) the power consumption of the shifting circuit.

Circuit 100' further comprises N-FETs N2* and N1* and P-FETs P2' and P5', and inverter 60'. The sources of N-FETs N2' and N1' are coupled to second reference line 192'. The gate of N-FET N2' is coupled to input terminal 101' and receives CLK. The gate of N-FET N1' is coupled to input terminal 101' via inverter 60' having input 61' and output 62'. Inverter 60' is coupled to third reference line 193' ($V_4$) and to second reference line 192' ($V_R$). Inverter 60' preferably comprises a combination of an N-FET and a P-FET which are not shown for simplicity. Second supply voltage $V_4$<$V_3$ of inverter 60' ensures that the P-FET does not become conductive for DATA=VCCL. DATA at output 62 alternates between VCCL and ZERO. First excursion 197 (FIG. 1) of DATA is large enough to switch the coupled N-FET N2'. The drain of N-FET N2' is connected to the source of N-FET N2*. The drain of N-FET N2* is connected to the drain of P-FET P2' via output node 103'. The drain of N-FET N1' is connected to the source of N-PET N1*.

The drain of N-FET N1* is connected to the drain of P-FET P5' (CTRL). The sources of P-FETs P2' and P5' are coupled together to first reference line 191'. The gate of P-PET P2 is coupled to the drain of P-FET P2' receiving CTRL.

When, for example, DATA rises from ZERO to VCCL, both N-FET N2 and P-FET P2 will be switched on, while N-FET N5 will be switched off. However, the voltage at output node 103 is pulled down sufficiently to make P-FET P5 conductive, and CTRL becomes VCCH. P-FET P2 is switched off by VCCH at the source of P-FET P5. This signal level at node W5 increases from ZERO to VCCH later than DATA increases from ZERO to VCCL. There are at least two reasons for this delay: (a) DATA is inverted twice (by N-FET N2' and P-FET P5') and (b) the source of P-PET P5' goes the longer way to VCCH and not the shorter way to VCCL.

If the transconductance g(N2') of N-PET N2' is sufficiently larger (e.g., 4 times) than g(P2'), output node 103' (OUT) will drop to zero quickly. This will turn on P-FET P5', which will put a value of VCCH on the source of P-FET P5', so that P-FET P2' switches off completely. Circuit 100' is asymmetrical. The fall time $t_{F3}'$ of second signal OUT at output node 103' from logical "1" (VCCH) to "0" (ZERO) is less than the rise time $t_{R3}'$ of output node 103 from "0" (ZERO) to "1" (VCCH). It is known in the art to connect output node 103' or the source of P-FET P5' to an inverter buffer. Such an inverter buffer can comprise, for example, a P-FET and an N-FET having common drains. However, adding an inverter stage will add propagation delay.

Prior art circuit 100' relies on contention to drive OUT to "0" which then turns off the driver P-FET P5'. To operate circuit 100', N-FET N2' should have a significantly larger transconductance than P-FET P2'. N-FET N1' should have a larger transconductance than P-FET P5'. The large transconductance requires a large silicon area so that the transistor sizes become unequal. Also, during switching, the power consumption of circuit 100' is higher than in other times.

FIG. 4 of U.S. Pat. No. 5,416,368—Sugibayashi (hereinafter [1]) shows a second prior art circuit. The circuit has a first switch (transistor Q3) for pulling an output node (18) to the high supply voltage (36). The circuit has a second switch (transistor Q4) for pulling the output node to a reference voltage (40). In the moment of change both switches are conducting. This contention is unwanted. One of the switches must therefore override the other. This causes substantial and unwanted delay.

FIGS. 2A–B of U.S. Pat. No. 5,469,080—Son (hereinafter [2]) show a third prior art circuit. P-channel transistor (P3) transfers a logical "0" signal to turn on a first switch (P2). It is known in the art that P-channel transistors transfer logical "0" signals slower than N-channel transistors. There is contention in the input stage (N1, P1) when the input signals (DATA, OE) change. A further limitation of [2] is that a voltage drop through the P-channel transistor (P3) causes the first switch (P2) not to switch on completely. Therefore, the output node (20) only reaches a "high" level substantially equal to the supply voltage (VCC2) minus the threshold voltage (Vth).

This invention seeks to provide a level shifting circuit which mitigates or avoids these and other disadvantages and limitations of the prior art.

BRIEF DESCRIPTION OF THE DRAWINGS

FIG. 1 is a simplified signal diagram of a first signal, a second signal, and a third signal;

FIG. 2 is a simplified circuit diagram of a first prior art circuit;

FIG. 3 is a simplified block diagram of an electronic system comprising low-voltage blocks and high-voltage blocks and an electronic circuit according to the invention;

FIG. 6 is a simplified signal timing diagram illustrating the second signal and a control signal;

DETAILED DESCRIPTION OF THE PREFERRED EMBODIMENT

Figure 4:
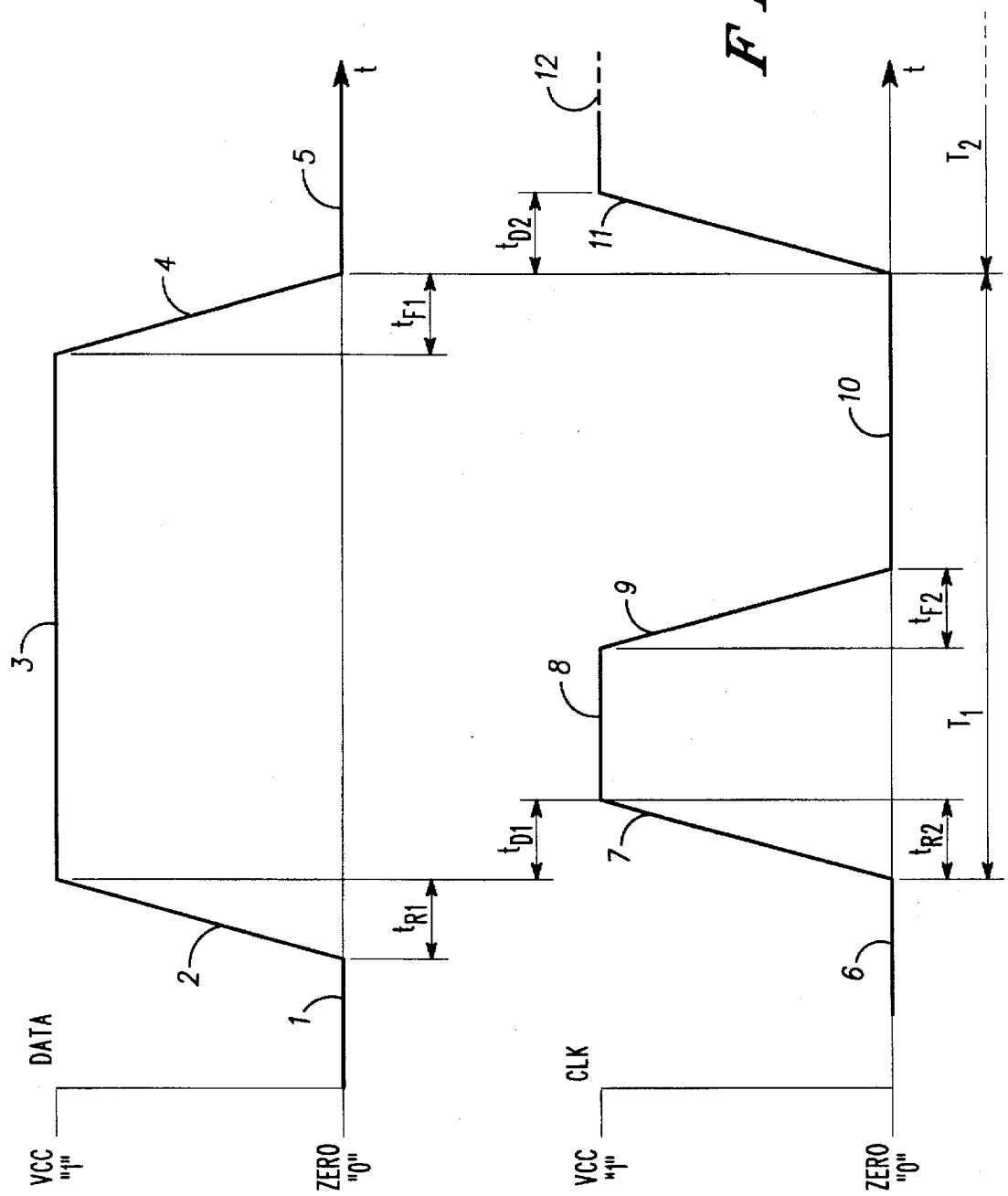
FIG. 4 is a simplified signal timing diagram illustrating the first signal and the third signal useful with the present invention.

According to the present invention, contention between the switches can be substantially avoided so that switching times and device size can be reduced in comparison to the prior art. These and other advantages will be apparent in the following description.

FIG. 3 is a simplified block diagram of electronic system 50 according to the present invention. Electronic system 50 comprises first block 10, second block 20, and shifting circuit 30. Block 10 is coupled to block 20 by way of shifting circuit 30. First block 10 sends a plurality $DATA_N$ of first signals DATA to shifting circuit 30 via N data lines 21. Shifting circuit 30 converts $DATA_N$ into a plurality $OUT_N$ of second signals OUT without changing the information of $DATA_N$. $OUT_N$ is transferred to block 20 through N data lines 31. $DATA_N$ and $OUT_N$ conveniently comprise N single bit first signals DATA and N single bit second signals OUT.

Shifting circuit 30 comprises a plurality of N electronic circuits 100 according to the invention. Every electronic circuit 100 transfers a first signal DATA into a second signal OUT without changing the information. Logical "0" of DATA is transferred to logical "0" of OUT at a substantially unchanged level (e.g., ZERO). For logical "1", VCCL of DATA is transferred to VCCH of OUT, and VCCH of DATA remains unchanged as VCCH of OUT. Also, logical "0" of DATA can be inverted to logical "1" of OUT at VCCH. Logical "1" of DATA (VCCH or VCCL) can be inverted to logical "0" of OUT at ZERO. First, second, third, and fourth embodiments (201, 202, 203, 204) of electronic circuit 100 will be described in reference to FIGS. 7–10.

Supply voltages $V_1$, $V_2$, $V_3$, and $V_4$ are related to the reference voltage $V_R$ (e.g., 0 volts). Supply voltage $V_1$ of block 10 can be variable and be either a high voltage $V_H$ or a low voltage $V_L$. DATA generated by block 10 can be either at VCCH (substantially equal to $V_H$) or VCCL, (substantially equal to $V_L$). The supply voltage $V_2$ of block 20 is a high voltage $V_H$. First supply voltage $V_3$ of shifting circuit 30 is a high voltage $V_H$ so that OUT alternates between ZERO and VCCH. Second supply voltage $V_4$ is a low voltage $V_L$. For example, second supply voltage $V_4$ can be derived from $V_3$ or generated in other ways understandable for a person of skill in the art. The supply voltage $V_1$ for block 10 is, for example, $V_L$=2.5 volts. In that case, DATA has a VCCL level of, preferably, between 1.8 volts to 2.5 volts. This level which should be increased to VCCH of, preferably, between 2.7 volts to 3.6 volts. In another example, block 10 is powered by $V_1$=3.3 volts and shifting circuit 30 and block 20 are powered by $V_2$=$V_3$=5 volts. Shifting circuit 30 and therefore electronic circuits 100 can have clock input 35 for receiving third signal CLK (175).

FIG. 4 is a simplified signal timing diagram illustrating by way of example the level-time relation of DATA (first signal) and CLK (third signal) as used in the present invention. The signals are approximated by trapezoids. The time t is indicated horizontally. DATA and CLK (vertically) alternate between VCC (logical "1") and ZERO (logical "0"). In FIG. 4, traces 1 to 5 show DATA and traces 6 to 12 show CLK. It is assumed that DATA goes to "1" before a first cycle of CLK (traces 7 to 10) starts and returns to "0" before a second cycle (beginning with trace 11) of CLK starts. The first cycle and the second cycle have equal cycle times $T_1$=$T_2$. At the beginning, DATA is at logical "0" (level ZERO, trace 1). DATA rises (trace 2) in a rise time $t_{R1}$ to logical "1" (level VCC). DATA stays at "1" for a certain time (trace 3). It falls (trace 4) to "0" (level ZERO) in a fall time $t_{F1}$.

CLK starts at logical "0" (level ZERO, trace 6). During the first cycle, CLK rises (trace 7) in a rise time $t_{R2}$ to "1", stays (trace 8), falls in fall time $t_{F2}$ (trace 7), and stays at "0" (trace 10). In the second cycle, CLK rises again (trace 11). The continuation is indicated by partly dashed trace 12.

In FIG. 4, rise times $t_{R1}$, $t_{R2}$ and fall times $t_{F1}$, $t_{F2}$ are equal. Also in FIG. 4, CLK has a symmetric pulse duty cycle. The "1"-time (traces 7,8,9) and "0"-time (trace 10) are equal. These assumptions are convenient, but not essential for the invention. As a person of skill in the art will understand based on the description herein, the rise and fall times depend among other things on the level VCC and will be longer for VCC=VCCH and shorter for VCC=VCCL. In FIG. 4, DATA does not change within one clock cycle. DATA returns to "0" (trace 4) after CLK has returned to "0" (trace 9). In this case, DATA envelops CLK. This is convenient, but not required. As it will be shown, DATA can change (fall as in trace 4) while CLK is "1". As it can be seen in traces 2 and 7 of FIG. 4, DATA reaches VCC by the first data setup time $t_{D1}$ earlier than CLK reaches VCC. In trace 4, DATA arrives at "0" (ZERO) by the second data setup time $t_{D2}$ earlier than CLK reaches VCC again (trace 11). Preferably, OUT has a similar trapezoidal shape as DATA with rise and fall times and times in which OUT stays constant. It is convenient to keep OUT constant for a certain time by latching means, but this is not essential.

Figure 5:
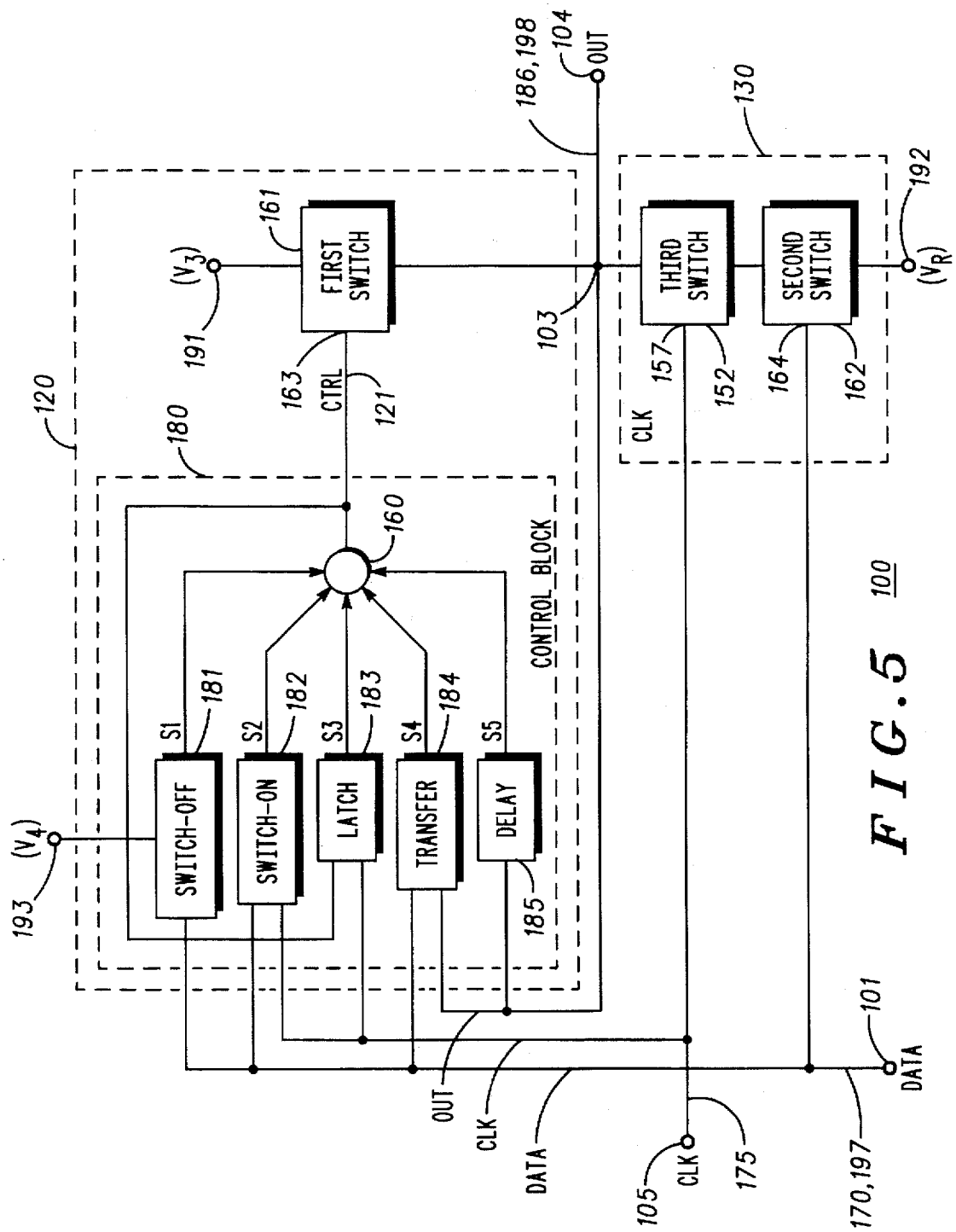
FIG. 5 is a simplified block diagram of an electronic circuit according to the invention which is part of the shifting circuit of FIG. 3.

FIG. 5 is a simplified block diagram of electronic circuit 100 according to the invention. Electronic circuit 100 is part of shifting circuit 30 of FIG. 3. All of the above-defined signals and terms are applicable. Electronic circuit 100 comprises first portion 120 and second portion 130 which are shown enclosed by dashed lines. First portion 120 comprises first switch 161 and control block 180 (dashed). Second portion 130 comprises second switch 162, and optional third switch 152. Electronic circuit 100 has input terminal 101 for receiving DATA (first signal 170), optional clock terminal 105 for CLK (third signal 175), output node 103, and output terminal 104 for providing OUT (second signal 186). Output node 103 is coupled to output terminal 104.

Electronic circuit 100 optionally comprises inverter and input stages which are not shown for simplicity. Electronic circuit 100 receives first supply voltage $V_3$ at first reference line 191 reference voltage $V_R$ at second reference line 192, and optionally second supply voltage $V_4$ at third supply line 193.

In first portion 120, an output path goes through first switch 161. First switch 161 is coupled between output node 103 and first reference line 191. Second switch 162 of second portion 130 is coupled between output node 103 and second reference line 192 (output path).

Control block 180 of first portion 120 optionally comprises one or more of blocks 181, 182, 183, 184, 185 and node 160. As it will be further explained, blocks 181–185 of control block 180 are coupled to some or all of input terminal 101, output node 103, and optionally to clock terminal 105. Control block 180 provides control signal 121, (hereinafter CTRL) at node 160. CTRL has a third excursion.

First switch 161 has first input 163 coupled to node 160 for receiving CTRL. First switch 161 pulls output node 103 to first reference line 191 in response to CTRL. Second switch 162 has second input 164 coupled to input terminal 101. Optionally, third switch 152 is serially coupled between second switch 162 and output node 103. As a person of skill in the art will understand, serially coupled second switch 162 and third switch 152 can be exchanged without departing from the scope of the invention. Having second switch 162 and third switch 152 serially coupled is convenient, but not necessary for the present invention. Optional third switch 152 has third input 157 which is, preferably, coupled to clock terminal 105.

DATA having first excursion 197 switches on and off first switch 162. However, first excursion 197 is not enough to switch first switch 161 on and off. First excursion 197 is transferred in control block 180 to third, different excursion of CTRL. First portion 120 and second portion 130 are switched on and off in response to DATA. For explanation, it is assumed that first portion 120 is switched on when DATA toggles in a first direction, and that second portion 130 is switched on when DATA toggles in a second, opposite direction. In one case, the first and second directions can be, for example, defined as between DATA=0 to DATA=1 (first direction) and DATA=1 to DATA=0 (second direction). In another case, DATA goes to DATA=0 in a first direction and goes to DATA=1 in a second direction.

In control block 180, blocks 181–185 are not all required simultaneously. Blocks 181–185 can be configured according to the environment in which electronic circuit 100 is to be used. Control block 180 of first portion 120 receives DATA from input terminal 101, optionally CLK from clock terminal 105, and optionally OUT from output node 103. DATA, CLK, OUT can be supplied in inverted form. Blocks 181, 182, 183, 184, and 185 generate intermediate signals S1, S2, S3, S4, and S5, respectively, which are combined in node 160 to CTRL. In the block diagram of FIG. 5, node 160 is a convenient symbol for any element for combining signals, e.g., logic circuitry. Blocks 181–185 are symbols illustrating that intermediate signals S1, S2, S3, S4 and S5 are functions f of DATA, CLK, CTLR, and OUT. When implemented, blocks 181–185 can share elements, such as transistors.

Switch-off block 181 receives DATA and generates intermediate signal S1=f(DATA). Preferably, block 181 comprises inverters or other elements for providing a delay. Intermediate signal S1 switches off first switch 161 after DATA toggles or during DATA toggles. Preferably, when intermediate signal S1 goes to logical "1", it switches off first switch 161 after DATA has returned from "1" to "0" (trace 4 in FIG. 4). When intermediate signal S1 goes to logical "0" it does not switch on first switch 161. Intermediate signal S1 can, therefore, be considered as a one way switch signal.

Switch-on block 182 receives DATA and CLK and generates intermediate signal S2=f(DATA, CLK). DATA and CLK are conjunctively combined. Intermediate signal S2 switches on first switch 161 but does not switch it off. Preferably, intermediate signal S2 at logical "0" switches on first switch 161 for DATA going to logical "1" and CLK going to logical "1". Therefore, intermediate signal S2 can also be considered as a one way switch signal.

Latch block 183 receives CTRL from node 160 (and, optionally, CLK) and generates intermediate signal S3=f(CTRL, CLK). Block 183 is a latch which keeps first switch 161 switched on once it is switched on. Signal S3 can be reset by CLK. Preferably, intermediate signal S3 is latched at logical "0". S3 returns to "1" when CLK goes from "1" to "0" (trace 9 in FIG. 4). Intermediate signal S3 is a weak signal and can be overruled by other intermediate signals. This is convenient when block 183, optionally, does not receive CLK.

Transfer block 184 receives DATA and OUT and generates intermediate signal S4=f(DATA, OUT). Thereby, intermediate signal S4 switches second switch 161 on and off by transferring DATA. The transfer of DATA to S4 is associated with a first delay of OUT.

Delay block 185 receives OUT and generates intermediate signal S5=f(OUT). Block 185 provides a second delay. Changes of OUT are transferred to intermediate signal S5 within a second delay time. Intermediate signal S5 switches first switch 161 off within a second delay time. Preferably, when OUT reaches logical "1" then intermediate signal S5 goes from logical "0" to logical "1".

Blocks 183, 184, 185 which receive OUT can be considered as feedback units coupled between output node 103 and first input 163 of first switch 161. OUT has thereby also the function of a feedback signal.

It is assumed that intermediate signals S1, S2, S3, S4 and S5 have excursions between VCCH at logical "1" and ZERO at logical "0". This is convenient for explanation, but not required for the present invention. As a person of skill in the art will understand, CTRL must only have an excursion to render first switch 161 conductive or non-conductive. It is included in the present invention, that intermediate signals S1, S2, S3, S4, and S5 can have excursions with an amount of less than |VCCL-ZERO|. The elements in blocks 181, 182, 183, 184, and 185 can be dimensioned so that intermediate signals S1, S2, S3, S4, S5 can have different strength. For example, if Si=0 and Sj=1 than only one of the signals prevails.

Preferably, CTRL has logical "1" at VCCH and logical "0" at ZERO. For further explanations, it is convenient to assume that CTRL=0 makes first switch 161 conductive and, therefore, switches on first portion 120. CTRL=1 makes first switch non-conductive and, therefore, switches off first portion 120. When switched on by CTRL, first portion 120 pulls output node 103 up to first reference line 191 (signal OUT to logical "1" at VCCH). When first portion 120 is switched off, than first portion 120 does not pull output node 103.

Second portion 130 is switched by DATA from input terminal 101 and optionally by CLK from clock terminal 105. DATA and CLK can be supplied in inverted from. When switched on depending on DATA and CLK, second portion 130 pulls output node 103 down to second reference line 192 (signal OUT to logical "0" at ZERO). When switched off, second portion 130 does not pull output node 103.

Control block 180 ensures that first portion 120 and second portion 130 are not switched on at the same time. Suppose, first portion 120 is switched on and pulls output node 103 to first reference line 191. OUT is at logical "1". Before second portion 130 pulls output node 103 down, first portion is switched off.

Circuits having a first switch and a second switch for pulling an output node to a logical high and logical low are well know in the art. The second prior art circuit [1] has a transistor in the input path of the first switch which serves as a voltage source. The transistor has the gate at a constant voltage and adds a constant voltage to the input signal.

In first portion 120 of electronic circuit 100 according to the present invention, blocks 184 and 182 can be implemented as variable resistances providing a variable voltage. CTRL can be related to that variable resistance. As an advantage of the present invention, contention between first portion 120 and second portion 130 is avoided.

The function of electronic circuit 100 according to the present invention and its advantage over prior art is illustrated by way of example in FIG. 6. FIG. 6 is a simplified signal timing diagram illustrating second signal OUT and control signal CTRL in their level-time relation. The time t is indicated horizontally. OUT and CTRL alternate between VCCH (logical "1") and ZERO (logical "0").

In FIG. 6, traces 41 to 43 show OUT and traces 13 to 15 show CTRL. For comparison, dashed lines indicate OUT* (trace 42a*, 42b*) and CTRL* (13*, 14*) of second prior art circuit [1]. For convenience of explanation, it is assumed that first portion 120 (FIG. 5) is switched on for CTRL at logical "1" (VCCH) and switched off for CTRL at "0". At the beginning, first portion 120 receives CTRL at logical "0" (trace 13) and is therefore switched on. Output node 103 is pulled to first reference line 191 and OUT is at logical "1" (trace 41). CTRL goes to logical "1" during a rise time $t_{R4}$ (trace 14) and switches first portion 120 off. OUT is kept at VCCH (trace 41*) by latching means optionally coupled to output node 103. As a person of skill in the art will understand, the latching means is not essential for the present invention and can be coupled to output node 103 externally. For simplicity, the latching means is not shown in FIG. 5. CTRL stays at logical "1" (trace 15). Second portion 130 is switched on and pulls output node 103 to second reference line 192. Therefore, OUT falls to logical "0" (in fall time $t_{F3}$, trace 42). During that time $t_{F3}$, first portion 120 has already been switched off. There is no contention between first portion 120 and second portion 130.

In second prior art circuit [1], CTRL* goes to "1" later (trace 14*). The first switch (transistor Q3) is being switched off while second switch (transistor Q4) already pulls OUT* to logical "0" (trace 42a*). As a result of this contention, OUT* (traces 42a*, 42b*) in the prior art falls at a lower rate than OUT (trace 42) in electronic circuit 100. When CTRL* has finally reached logical "1" (end of trace 14*), OUT* has not yet reached logical "0". OUT* falls now (trace 42b*) at the same rate as OUT (trace 42). However, the total fall time $t_{F3}$* of OUT* (trace 42a* and 42b*) is greater than the fall time $t_{F3}$ of OUT (trace 42). The first switch and the second switch are partly on at the same time. As an advantage of the present invention, electronic circuit 100 reduces the fall time $t_{F3}$ of OUT compared to prior art solutions.

First switch 161 and second switch 162 preferably comprise complementary components (e.g., P-channel and N-channel transistors, respectively). Preferably, the elements (as for example, of second switch 162 and of control block 180) which receive DATA directly from input terminal 101 are implemented by N-channel FETs which can be turned on and off by DATA at VCCL and ZERO.

In case first switch 161 is implemented by, for example, a P-channel FET, then the signal level at first input 163 (gate) should be at VCCH to switch first switch 161 off. The required signal level VCCH, is for example, provided by an N-channel FET adding a voltage to VCCL. The additional voltage can also be provided by the mentioned input stage.

As a person of skill in the art will see, electronic circuit 100 can be modified without departing from the scope of the present invention. For example, clock signal CLK or data signal DATA can have logical states "1" and "0" at levels different from the explained levels VCCH, VCCL, and ZERO. There are several ways of switching off first portion 120 before second portion 130 is switched on. Other implementations are conceivable for a person of skill in the art.

As an example and not intended to be limiting, four embodiments of the present invention shown in FIGS. 7–10 are implemented in CMOS-technology using N-channel and P-channel field effect transistors (N-FETs, P-FETs). The FETs have a control electrode (gate, G), a first electrode (drain, D) and a second electrode (source, S). Since FETs are typically symmetrical components, the true designation of "source" and "drain" is only possible once a voltage is impressed on the terminals. The designations of source and drain herein should be interpreted, therefore, in the broadest sense. The term 'FET' is intended to include any component having current and control electrode, such as for example, bipolar components. The terms 'first type' and 'second type' are intended to distinguish complementary transistors of opposite conductivity. Preferably, transistors of the first type are P-FETs and transistors of the second type are N-FETs. This is convenient, but not essential for the present invention. Other configurations and manufacturing technologies can also be used, as will be understood by persons skilled in the art. Preferably, the bulks of the FETs are coupled to a reference line for receiving a supply voltage or a reference voltage. For simplicity, the bulks are not shown on the simplified schematic diagrams which will be explained below.

FIGS. 7–10 illustrate by way of example, four embodiments of the present invention. In all embodiments, first switch 161 is implemented by P-FET P1 and second switch 162 is implemented by N-FET N1. Details for the first, second, and third embodiment of the invention are explained in connection with FIGS. 7–9. Third switch 152 is implemented by N-FET N4. Where applicable, dashed frames enclose blocks 181–185, first switch 161, and second portion 130, and input stage 110. The frames can overlap. For convenience, reference numbers are given in the right upper corner of the frames.

The first, second and third embodiments have the function of a transfer gate, providing OUT at equal logical state as DATA when CLK is at a first logical state ("1"). The fourth embodiment provides OUT inverted to DATA.

Figure 7:
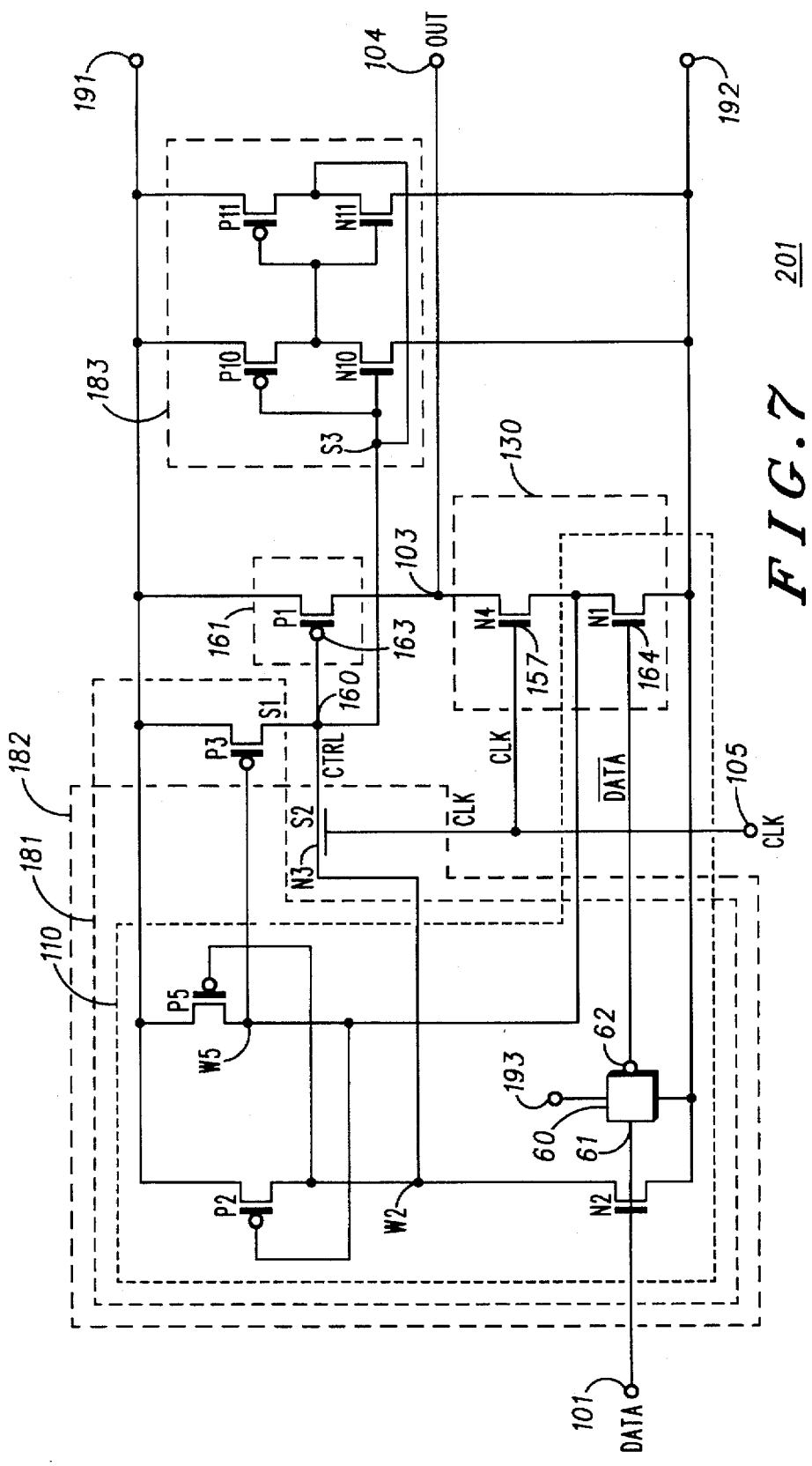
FIG. 7 is a simplified schematic diagram of the electronic circuit of FIG. 5 according to a first embodiment of the invention.

FIG. 7 is a simplified schematic diagram of electronic circuit 201 according to a first embodiment of the invention. Control signal CTRL is derived in node 160 from intermediate signals S1=f(DATA), S2=f(DATA, CLK) and S3=f (CTRL). S2=0 switches first switch 161 (P-FET P1) on, S1=1 switches it off, and S3 latches CTRL.

Reference numbers 101, 103, 104, 105, 161, 130 in FIG. 5 and FIG. 7 denote identical components described above. Electronic circuit 201 has first reference line 191 for receiving first supply voltage $V_3=V_H$ and second reference line 192 at a reference voltage $V_R$ (e.g., ground 0 volts). Second supply voltage $V_4=V_L$ is supplied at third reference line 193. Supply voltage $V_3$ is substantially equal or higher than VCCH.

Input stage 110 (dashed) comprises N-FETs N2 and N1, P-FETs P2 and P5, and inverter 60. The sources of N-FETs N2 and N1 are coupled to second reference line 192. The gate of N-FET N2 is coupled to input terminal 101. The gate of N-FET N1 is coupled to input terminal 101 via inverter 60 having input 61 and output 62. Inverter 60 is coupled to third reference line 193 ($V_4=V_L$) and to second reference line 192 ($V_R$). Inverter 60 preferably comprises a combination of an N-FET and a P-FET as known in the art. Inverter 60 has a low supply voltage $V_L=V_4$ to ensure that the P-FET does not become conductive for DATA=VCCL. DATA at output 62 alternates between VCCL and ZERO which is enough to switch the coupled N-FET N1. The drain of N-FET N2 is coupled to the drain of P-FET P2 via node W2. The drain of N-FET N1 is coupled to the drain of P-FET P5 via node W5.

The sources of P-FETs P2 and P5 are coupled together to first reference line 191. The gate of P-FET P2 is coupled to node W5 and the gate of P-FET P5 is coupled to node W5.

Electronic circuit 201 further comprises N-FETs N3, N10 and N11 and P-FETs P1, P3, P10, and P11. P-FET P1 has the function of first switch 161 (dashed) with the gate as first input 163. Block 182 is formed by the elements of input stage 110 (N1, N2, P2, P5, and inverter 60) and N-FET N3. Block 182 receives DATA at the gate of N-FET N2 and CLK at the gate of N-FET N3. Block 182 provides intermediate signal S2=f(DATA, CLK) at the source of N-FET N3. Block 182 is formed by the elements of input stage 110 and P-FET P3. Block receives DATA at the gate of N-FET N2 and supplies intermediate signal S2=f(DATA) at the drain of P-FET P3. BETs, N10, N21, P10, and P11 form block 183. Block 183 receives CTRL at the gates of BETs P10/N10 and supplies S3=f(CTRL) at the common drains of FETs P11/ N11.

The sources of P-FETs P1 and P3 are coupled to first reference line 191. The drain of P-FET P3 is coupled to the gate of P-FET P1 via input 163 and coupled to the drain of N-FET N3. The drain of P-FET P1 is coupled to output node 103. The gates of N-FET N3 and P-FET P3 are coupled to nodes W2 and W5 of input stage 110, respectively. The gate of N-FET N3 is coupled to clock terminal 105 and is controlled by CLK. Block 183 is formed by P-FETs P10, P11 and N-FETs N10, N11 arranged as two cascoded inverters. The gates of P10/N10 are coupled to node 160 and to the common drains of P11/N11 (providing S3).

Second portion 130 (dashed) comprises serially arranged N-FETs N1 and N4. Here, N-FET N1 has the function of second switch 162 with second input 164 at the gate. N-FET N1 is also part of input stage 110 (and blocks 181, 182). This is a convenient simplification. A person of skill in the art will be able to provide separate N-FETs for input stage 110 and for second portion 130. N-FET N4 has the function of third switch 152 with third input 157 at the gate. The source of N-FET N1 is coupled to second reference line 192. The drain of N-FET N1 is coupled to the source of N-FET N4. The drain of N-FET N4 is coupled to output node 103. The gate of N-FET N1 is coupled to output 62 of inverter 60 (input stage 110) for receiving DATA (inverted DATA). This is a convenient simplification of the circuit. It is also possible to couple the gate of N-FET N1 to input terminal 101 via an additional inverter. The gate of N-FET N4 receives CLK from clock terminal 105.

Electronic circuit 201 and electronic circuits 202 and 203 (described later) can also be described as follows: Electronic circuits 201–203 receive DATA (first signal 170) and CLK (second signal 175) which arrive consecutively. OUT (second signal 186) is responsive to DATA. First excursion 197 of DATA is amplified to second excursion 198 of OUT. First transistor P1 of a first type (e.g., P-FET) provides VCCH of OUT when it is switched on by a first intermediate signal (S2). S2 is derived from a first serial arrangement of third transistor N2 of a second type (e.g., N-FET) receiving DATA and of fourth transistor N3 (N-FET) which receives CLK. A second serial arrangement provides ZERO of OUT. The second serial arrangement has first transistor N1 and second transistor N4. N1 and N4 are of a second, opposite, type (n-FET). N1 is gated by DATA and N4 receives CLK. The second serial arrangement is coupled to a gate of first transistor P1 of the first type (P-FET) without an intervening P-FET.

In input stage 110, the transconductance g(N2) of N-FET N2 is preferably higher than the transconductance g(P2) of serially coupled P-FET P2. It is convenient to have a ratio g(N2)/g(P2)=4. This provides a short fall time of node W2 when DATA goes to "1" and prevents contention. N-FET N2 is the transistor which receives DATA from input terminal. As mentioned above, the use of an N-type transistor is convenient because the gate voltage for logical "1" can be VCCL or VCCH. The voltage swing VCCL-ZERO (or VCCH-ZERO) of DATA is sufficient to switch N-FET N2. Therefore, additional circuitry is not required.

The function of electronic circuit 201 is described in reference to the signal timing diagrams of FIG. 4 and FIG. 6. When DATA goes to "1" (VCCL or VCCH) during $t_{R1}$ (trace 2), node W2 is quickly pulled to "0" by N-FET N2. This makes P-FET P5 conductive and node W5 is pulled to "1" at VCCH. Output 62 of inverter 60 goes to "0". In first portion 120, N-FET N3 is non-conductive because of CLK=0 and P-FET P3 is non-conductive because of W5=1. When CLK goes to "1" (trace 7), N-FET N3 of becomes conductive and transfers the "0"-signal at node W2 to node 160 (signal S2). P-FET P3 (signal S1) and inverter N11/P11 (signal S3) do not contribute to node 160 so that CTRL becomes "0".

P-FET P1 (first switch 161) becomes conductive and pulls output node 103 to "1". First portion 120 is now switched on. N-FET N3 becomes conductive when its gate-source voltage $V_{GS}$ passes the threshold voltage $V_t$. This happens already during $t_{R2}$ while CLK is increasing. Thus, a fast operation is achieved.

When DATA goes to "0" during $t_{F1}$ (trace 4), node W2 is pulled up to "1" and node W5 is pulled down to "0". P-FET P3 becomes conductive (signal S1=1) and pulls node 160 to first reference line 191, thus setting CTRL to "1". P-FET P1 becomes non-conductive. First portion 120 is switched off. Output node 103 is released. This is an important aspect of the invention. In this moment, P-FET P1 (first switch 162) and N-FET N1 (second switch 162) are not conducting. Contention between both switches is avoided. Block 183 has the function of a latch. Block 183 keeps node 160 at CTRL=1 (signal S3), even when DATA would return to "1". Output 62 of inverter 60 goes to "1" so that N-FET N1 (second switch 162) of second portion 130 becomes conductive. When CLK goes to "1" (trace 7), N-FET N4 also becomes conductive. With N-FET N4 as third switch 152 and N-FET N1 as second switch 162 being conductive, output node 103 is pulled to "0" and OUT becomes OUT=0.

Figure 8:
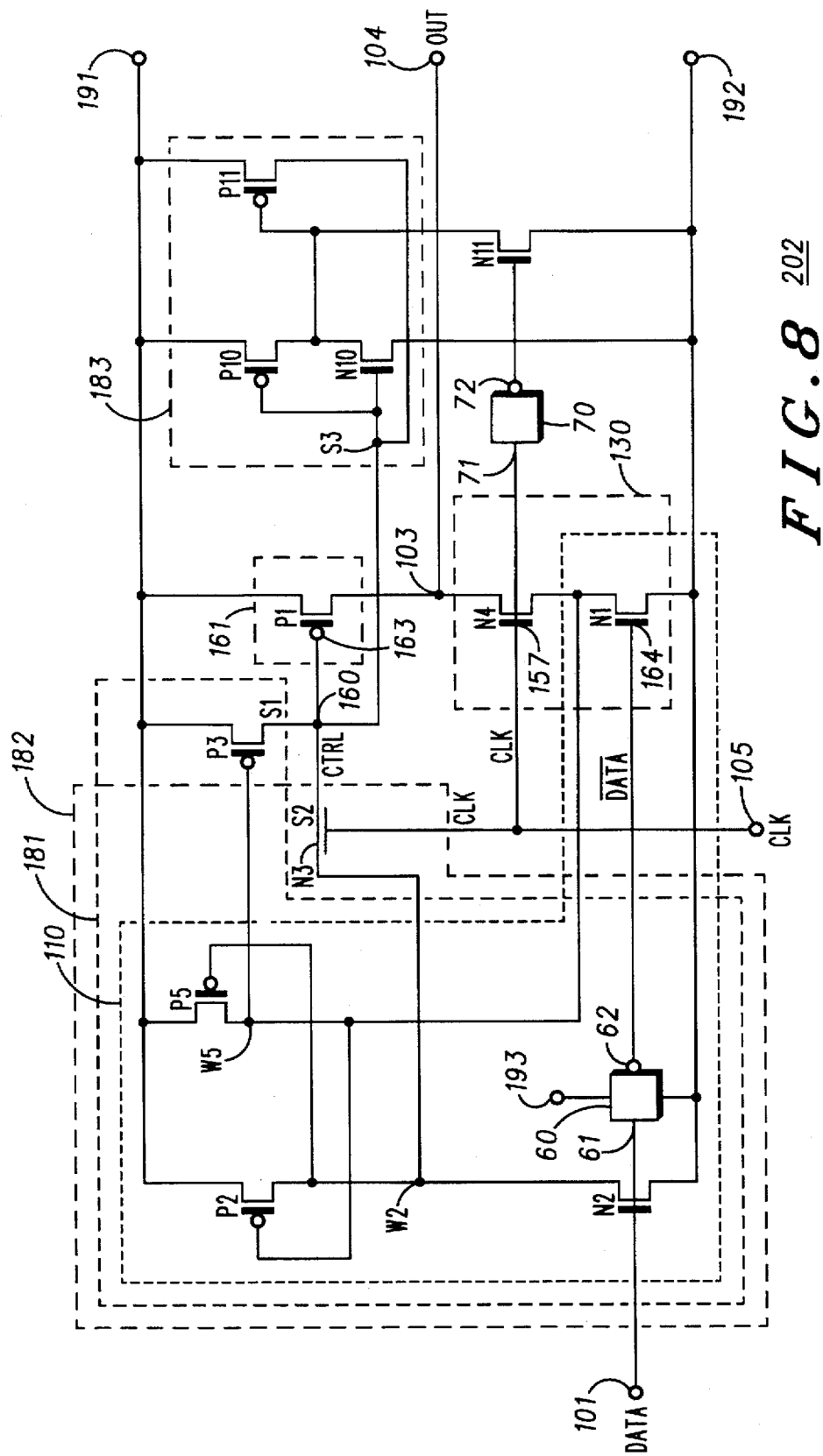
FIG. 8 is a simplified schematic diagram of the electronic circuit of FIG. 5 according to a second embodiment of the invention.

FIG. 8 is a simplified schematic diagram of the electronic circuit 202 in a second embodiment of the invention. Electronic circuit 202 is a modification of electronic circuit 201. In FIGS. 7–8, equal reference numbers denote identical components.

Control signal CTRL is derived in node 160 from intermediate signals S1=f(DATA), S2=f(DATA, CLK) and S3=f (CTRL, CLK). S2=0 switches first switch 161 (P-FET P1) on. S1=1 switches second switch 161 off. S3 retains a signal CTRL=1 as long as CLK=1. For CLK=1, S3 switches second switch 161 off. That means that second switch 161 can be switched off when CLK goes to logical "0" (FIG. 4, trace 9) or when DATA goes to logical "0" (trace 4).

Compared to electronic circuit 201 (FIG. 7), block 183 of electronic circuit 202 (FIG. 8) further comprises inverter 70 having input 71 receiving CLK and output 72 supplying CLK. N-FET N11 has its source coupled to second reference line 192 and its drain coupled to the gate of P-FET P11. N-FET N11 is gated by CLK. The combination of FETs N10, P10, N11, P11 and inverter 70 (block 183) form a latch which can be reset. When CLK=1 then CTRL can be latched. If CTRL=0 and CLK goes to "0" than N-FET N11 causes P-FET P11 to drive CTRL to "1". Preferably, N-FET N11 has a much larger transconductance than P-FET P10. When P-FET P10 is conductive (CTRL=1) and CLK goes to logical "1" than P-FET P10 is overdriven by N-FET N11 and S3=CTRL toggles and switches off P-FET P1. If CTRL=1 than N-FET N11 and CLK have no influence on S3. When CTRL=1 then P-FET P1 (first switch 161) is non-conductive and first portion 120 is switched off.

Electronic circuit 201 (first embodiment) and electronic circuit 202 (second embodiment) switch first portion 120 off for DATA or CLK returning to ZERO. This is convenient for an environment in which DATA returns to ZERO before or after CLK. If DATA always envelops CLK, that means if DATA goes to "0" after CLK goes to "0" (traces 4 and 9 in FIG. 4), P-FETs P2, P3 and P5 are not required and can be disposed of. This will be further explained in connection with electronic circuit 203 of FIG. 9 (third embodiment).

Electronic circuit 202 (FIG. 8) as the second embodiment of the present invention is compared to prior art circuit 100' (FIG. 2). As an example, a simulation was performed for rise and fall times depending on setup times. The simulation method was SPICE. This simulation method are known in the art and a skilled person will obtain equivalent results by other simulation methods. It is assumed that the rise times $t_{R1}$, $t_{R2}$ and the fall times $t_{F1}$, $t_{F2}$ of DATA and CLK (FIG. 4), respectively, are $t_{RF}=1$ nano seconds (ns). The output capacitance between output terminal 104 (104') and second reference line 192 (192') is around 0.35 pico farads. In the following, signals and times belonging to prior art circuit 100' are dashed. OUT and OUT' rise during rise times $t_{R3}$, $t_{R3}$' and fall during fall times $t_{F3}$, $t_{F3}$'. The times $t_{R3}$, $t_{R3}$', $t_{F3}$, and $t_{F3}$' for OUT and OUT' are defined in the same way as $t_{R1}$, $t_{F1}$ (FIG. 4) for DATA. DATA rises or falls before CLK rises to "1". The data setup times $t_{D1}$ (DATA rises) and $t_{D2}$ (DATA falls, FIG. 4) are varied.

The simulation results are shown in tables 2 and 3 each having columns (1) to (5). Column (1) gives the setup times $t_{D1}$, $t_{D2}$ as a simulation parameter. In columns (2) and (3) the rise times $t_{R3}$ for OUT (present invention) and $t_{R3}$' for OUT' (prior art), respectively, are compared. In columns (4) and (5) the fall times $t_{F3}$ for OUT and $t_{F3}$' for OUT', respectively, are compared. In all cases, OUT, OUT' and CLK alternate between ZERO=0 volts and VCCH=3.6 volts.

The simulation of table 2 assumes that DATA alternates between ZERO=0 volts and VCCH=3.6 volts. DATA is transferred to OUT and OUT' without level shifting.

TABLE 2

| (1) setup time | (2) DATA rises | (3) DATA rises | (4) DATA falls | (5) DATA falls |
|---|---|---|---|---|
| circuits 202, 100' (invention and prior art) | circuit 202 (invention) | circuit 100' (prior art) | circuit 202 (invention) | circuit 100' (prior art) |
| $t_{D1}, t_{D2}$ (ns) | $t_{R3}$ (ns) (OUT) | $t_{R3}'$ (ns) (OUT') | $t_{F3}$ (ns) (OUT) | $t_{F3}'$ (ns) (OUT') |
| 0 | 0.74 | 0.68 | 0.5 | 1.63 |
| 0.5 | 0.5 | 0.44 | 0.22 | 1.26 |
| 0.8 | 0.45 | 0.43 | 0.21 | 1.20 |

A variation of the setup times does not lead to a significant improvement of rise times. For a setup time $t_{D2}$=0.5 nano seconds, the fall time $t_{F3}$=0.22 ns of electronic circuit 202 is around 5 times shorter than $t_{F3}'$=1.26 ns of prior art circuit 100'.

The simulation of table 3 assumes that DATA alternates between ZERO=0 volts and VCCL=1.8 volts so that the logical "1" level is shifted to VCCH=3.6 volts.

TABLE 3

| (1) setup time | (2) DATA rises | (3) DATA rises | (4) DATA falls | (5) DATA falls |
|---|---|---|---|---|
| circuits 202, 100' (invention and prior art) | circuit 202 (invention) | circuit 100 (prior art) | circuit 202 (invention) | circuit 100' (prior art) |
| $t_{D1}, t_{D2}$ (ns) | $t_{R3}$ (ns) (OUT) | $t_{R3}'$ (ns) (OUT') | $t_{F3}$ (ns) (OUT) | $t_{F3}'$ (ns) (OUT') |
| 0 | 1.29 | 1.47 | 1.27 | 1.87 |
| 0.5 | 0.94 | 1.12 | 0.88 | 1,68 |
| 0.8 | 0.89 | 1.09 | 0.83 | 1.65 |

When DATA arrives simultaneously with CLK ($t_{D2}$=0), electronic circuit 202 shows an improvement in fall time $t_{F3}$ by 0.6 ns (1.87–1.27) or 50% compared to prior art. For a setup time of $t_{D2}$=0.5 ns, the improvement is around 0.8 ns (1.68–0.88). That means, OUT of electronic circuit 202 falls twice as fast as OUT' of prior art circuit 100'.

Figure 9:
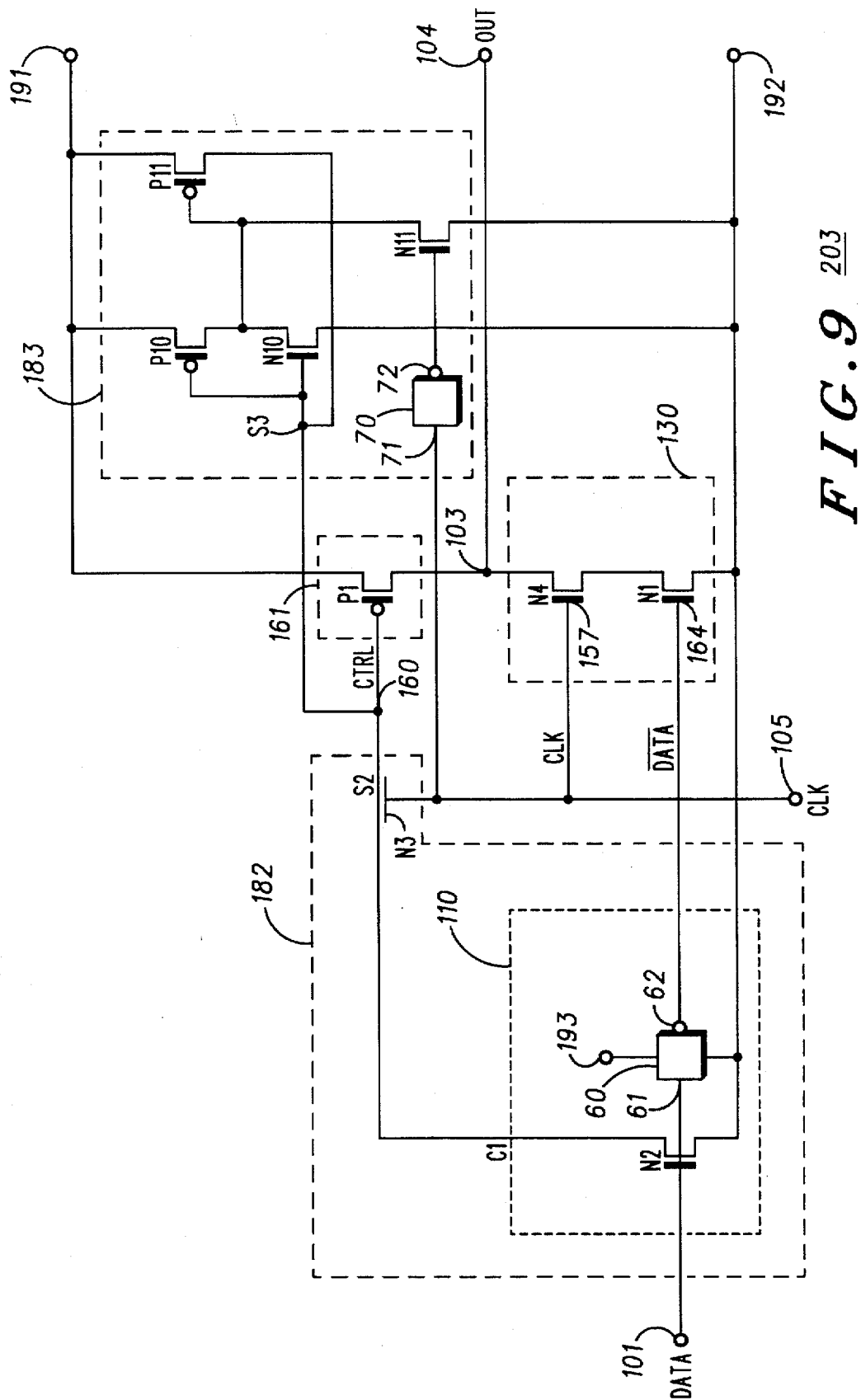
FIG. 9 is a simplified schematic diagram of the electronic circuit of FIG. 5 according to a third embodiment of the invention.

FIG. 9 is a simplified schematic diagram of electronic circuit 203 in a third embodiment of the invention. Control signal CTRL is derived in node 160 from intermediate signals S2=f(DATA, CLK) and S3=f(CTRL, CLK). S2=0 switches first switch 161 (P-FET P1) on and S3 latches CTRL. Electronic circuit 203 of FIG. 9 is similar to electronic circuit 202 of FIG. 8. Reference numbers denote identical components as in FIG. 8. Electronic circuit 203 comprises less components as electronic circuit 202. P-FETs P2, P3 and P5 are left out. There is no intermediate signal S1. The use of electronic circuit 203 is restricted to environments in which DATA envelops CLK. This is not necessarily a disadvantage, but a chip area reducing simplification of a circuit. First portion 120 is switched off when CLK goes to logical "1". If DATA would go to "0" before CLK, then the signal C1 at the drain of N-FET N2 would not be high enough to switch off P-FET P1. In that case, contention would occur with P-FET P1, and N-FETs N1 and N4 conducting. Therefore, DATA shows no change while CLK=1.

The function of electronic circuit 203 is explained in reference to the signal timing diagrams of FIG. 4 and FIG. 6. To operate electronic circuit 203, DATA should envelop CLK. Suppose, that DATA=0 and CLK=0 (traces 1 and 6). N-FET N2 is non-conductive. N-FET N1 (second switch 162) receives DATA=1 from inverter 60 and is conductive. Serial coupled N-FET N4 (third switch 152) receives CLK=0 and is non-conductive. Second portion 130 is therefore switched off. DATA rises to logical "1" at VCCL or VCCL (trace 2). N-FET N2 becomes conductive and provides signal C1 at its drain as C1=0. N-FET N1 receives DATA=0 and is non-conductive. When CLK becomes CLK=1 (trace 7), N-FET N3 becomes conductive and transfers C1=0 as CTRL=0 to P-FET P1 (first switch 161). P-FET P1 pulls output node 103 to first reference line 191 and OUT becomes OUT=1. During CLK=1 (trace 8), CTRL=0 is latched by FETs N10, P10, P11. N-FET N11 receives CLK=0 and is non-conductive. OUT stays at OUT=1. When CLK goes to "0" again (trace 9), N-FET N11 becomes conductive. P-FEP P11 pulls CTRL to logical "1" which causes P-FET P1 to become non-conductive. Now, both switches (N-FET N1 and P-FET P1) are not conducting. When the cycle repeats, N-FET N1 is able to pull output node 103 down again. Contention is therefore avoided.

Figure 10:
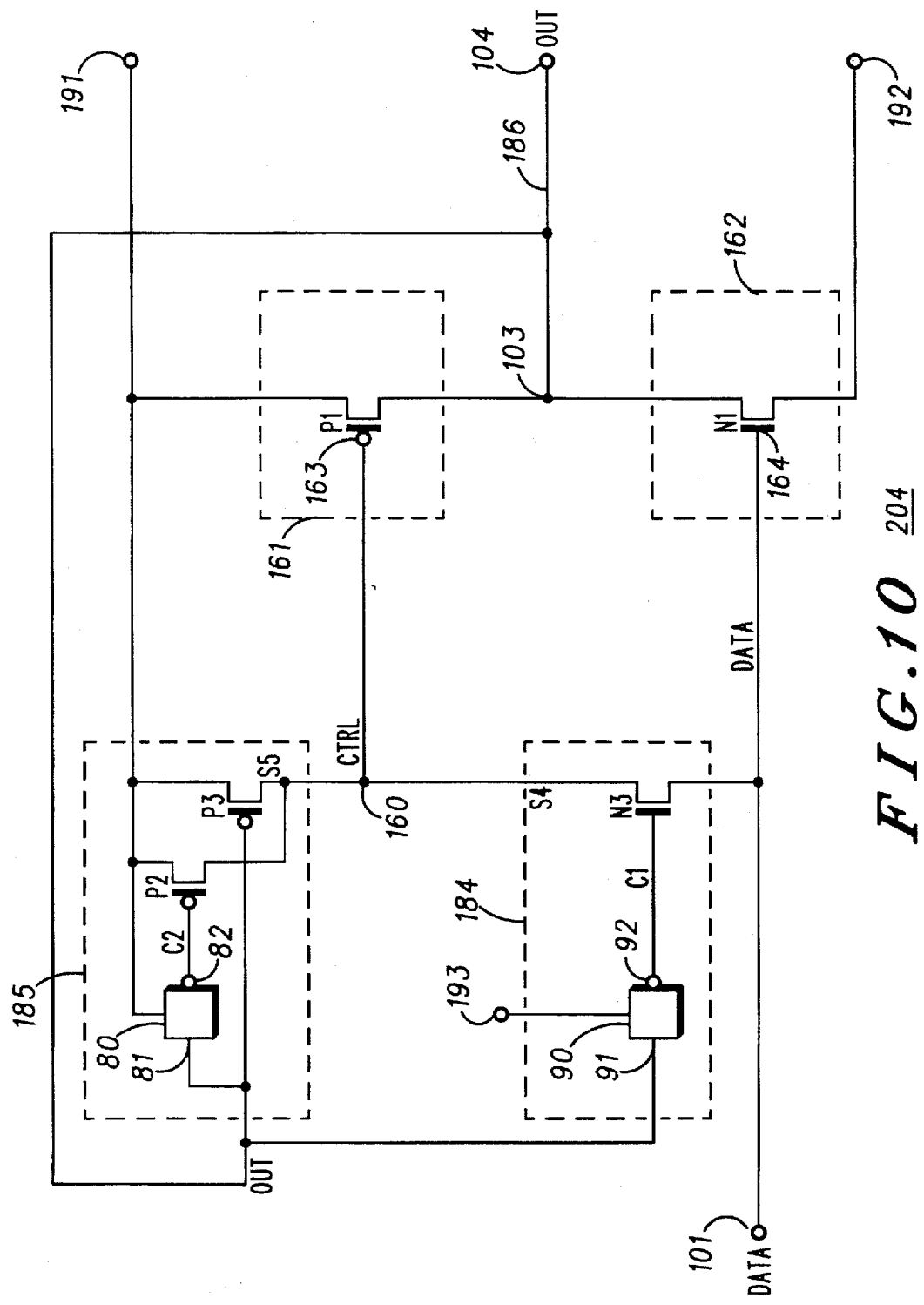
FIG. 10 is a simplified schematic diagram of the electronic circuit of FIG. 5 according to a fourth embodiment of the invention.

FIG. 10 is a simplified schematic diagram of electronic circuit 100 of FIG. 5 in a fourth embodiment of the invention. Electronic circuit 204 is a buffer type level shifter. Control signal CTRL is derived in node 160 from intermediate signals S5=f(OUT) of delay block 185 and S4=f (DATA, OUT) of block 184. In the following, the fourth embodiment is referred to as electronic circuit 204. The description of electronic circuit 204 adds details to the description of electronic circuit 100 of FIG. 5.

Electronic circuit 204 comprises N-FETs N1, N3, P-FETs P1, P2, P3 and inverters 80 and 90. Electronic circuit 204 has first reference line 191 at $V_3$, third reference line 193 at $V_4$, and second reference line 192 at $V_R$. Input terminal 101 supplies DATA. Output node 103 supplies OUT to output terminal 104. For convenience, the signals at the gates of FETs P2 and N3 are referred to as signals C2 and C3, respectively. CTRL is the signal at the gate of P-FET P1.

P-FET P1 (first switch 161, dashed) is coupled at the source to first reference line 191. N-FET N1 (second switch 162, dashed) is coupled at the source to second reference line 192. The drains of P-FET P1 and N-FET N1 are coupled together to output node 103. The gate of N-FET N1 (second input 164) is coupled to input terminal 101. The gate of P-FET P1 (first input 163, signal CTRL) is coupled to input terminal 101 via the drain-source path of N-FET N3. In block 185 (dashed), P-FETs P2 and P3 are parallel coupled and have their sources at first reference line 191 and their drains at the gate of P-FET P1 (first input 163). The gate of P-FET P3 and input 81 of inverter 80 are coupled to output node 103 for receiving OUT. The gate of P-FET P2 is coupled to output 82 (signal C2) of inverter 80. In block 184 (dashed), inverter 90 is coupled with input 91 to output node 103 and output 92 to the gate of N-FET N3 (signal C3). P-FET P2 and P-FET P3 of block 185 have a much smaller transconductance than that of N-FET N3 of block 184. In blocks 185, inverter 80 is coupled to first reference line 191. In block 184, inverter 90 is coupled to third reference line 193. Inverters 80, 90 are also coupled to second reference line 192 which is not shown for simplicity. The signals at outputs 82 and 92 have therefore logical "0" at ZERO and logical "1" at VCCH and VCCL, respectively.

DATA=1 switches on N-FET N1 (second switch 162) which pulls OUT to logical "0" at ZERO. DATA=0 is transferred through N-FET N3 and switches on P-FET P1 (first switch 161). OUT is the feedback signal for blocks 184 and 185 which provide intermediate signals S4=f(DATA, OUT) and S5=f(OUT), respectively.

Suppose, a DATA=0 has been transferred to the gate of P-FET P1 via N-FET N3. P-FET P1 is conductive and pulls OUT to OUT=1 at VCCH. In block 185, OUT=1 at VCCH is applied to P-FET P3 which stays non-conductive. OUT=1 is inverted in inverter 80 to C2=0 with a first delay time. The length of the delay time is determined by inverter 80. C2=0 makes P-FET P2 conductive which provides intermediate signal S5=1. In block 184, OUT=1 at VCCH is inverted in inverter 90 to C3=0 with a second delay time. C3=0 makes N-FET N3 non-conductive. Intermediate signal S4 is not driven by N-FET N3. CTRL is composed only of S5=1 so that P-PET P1 gets non-conductive. First portion 120 (FIG. 5) is switched off.

Suppose, DATA becomes DATA=1 at VCCL or VCCH. N-FET N1 becomes conducting and drives OUT quickly to OUT=0. There is no contention because P-PET P1 has been switched off. Now, in block 184, OUT=0 at inverter 90 changes signal C3 to C3=1 at VCCL. Thereby, N-FET N3 becomes capable of transferring DATA at logical "0" to intermediate signal S4 and CTRL. However, DATA at logical "1" has a level of VCCL or VCCH. The gate source-voltage $V_{GS}$ of N-PET 3 is in that case $V_{GS}$=VCCL–VCCL or $V_{GS}$=VCCL–VCCH, respectively, which is smaller than the threshold voltage $V_t$ of N-FET N3. N-FET N3 is operating in the subthreshold region and does not conduct when DATA is higher than VCCL. With signal OUT=0, P-FET P3 is conductive and retains intermediate signal S5=CTRL=VCCH at the gate of P-FET P1.

Suppose, DATA goes from logical "1" (VCCH or VCCL) to logical "0" (ZERO). Signal C3 is still at VCCL, so that $V_{GS}$ of N-FET N3 passes $V_t$. N-FET N3 becomes conducting and transfers DATA=ZERO as S4 to CTRL. Because of the different transconductances of P-FET P3 and N-FET N3, intermediate signal S5 at VCCH is weaker than S4 so that CTRL goes to ZERO. P-FET P1 pulls OUT to VCCH and the cycle can start again.

Preferably, P-FET P1 and N-PET N1 are dimensioned with substantially equal conductivities. As it is not shown in FIG. 10 for simplicity, OUT of electronic circuit 204 should be latched. This can be accomplished by circuitry well known in the art without changing the scope of the present invention. Electronic circuit 204 as the fourth embodiment of the invention does not receive CLK. However, a person of skill in the art will be able to add a clock signal as described above. For example, as third switch 152 an additional CLK-gated N-FET can be coupled serially to N-FET N1. For example, it is also possible to implement block 185 as shown in connection with the fourth embodiment into the first, second, or third embodiment.

The apparatus (electronic circuit 100) according to the invention amplifies DATA (first signal 170) to OUT (second signal 186). DATA alternates between logical "1" and "0" and assumes logical "0" during a first time interval. Electronic circuit 100 comprises first transistor P1 of a first type (e.g., P-FET) and a first transistor N1 of a second type (e.g., N-FET). DATA is amplified to OUT by the following steps:

1. DATA at logical "0" is transmitted through second transistor N3 of a second type (e.g., N-FET) but not through a transistor of said first type (e.g., P-FET) to a gate of transistor P1. Thereby P1 is made conductive.
2. A time delay is initiated when transistor P1 becomes conductive. The time delay is determined by inverter 90 which receives OUT. The time delay is shorter than the first time interval.
3. CTRL (control signal 121) is provided by inverter 80 at the end of the time delay to transistor P1. P1 becomes non-conductive.
4. Transistor N1 is made conductive when DATA assumes logical "1". Transistor P1 and transistor N1 are non-conductive after the time delay, so that contention is substantially avoided. When DATA is transmitted, transistor P1 becomes completely conductive and OUT goes to VCCH. VCCH is substantially equal to first supply voltage $V_3$ which is applied to an electrode of P1.

Electronic circuit 100 amplifies DATA at first excursion 197 to OUT at second excursion 198. Electronic circuit 100 comprises first switch 161 which provides VCCH of OUT and second switch 162 which provides ZERO of OUT. The method has the following steps:

1. First switch 161 is switched on when DATA toggles in a first direction (e.g., from logical "1" to "0"). OUT toggles for a first time.
2. Control block 180 switches off first switch 161 after a delay time interval. The interval is initiated when OUT toggles for the first time. Inverter 90 having the function of a delay unit determines the duration of the time interval. The time interval is shorter than the time between DATA toggles in the first direction (e.g., "1" to "0") and DATA toggles in a second, opposite, direction (e.g., "0" to "1").
3. Second switch 162 is switched on when DATA toggles in the second direction (DATA goes, e.g., to "1"). Thereby, it is avoided that first switch 161 and second switch 162 are switched on at the same time.

In electronic circuits 201, 202, 203, and 204, OUT reaches a VCCH which is substantially equal to first supply voltage $V_3$ at first reference line 191. This is higher compared to third prior art circuit from [2]. In electronic circuits 201, 202, 203, and 204, there is no P-FET in the input path between input terminal 101 and the gate of P-FET P1.

In the foregoing detailed description of the preferred embodiment, reference was made to the accompanying drawings which form a part hereof, and in which were shown by way of illustration specific embodiments in which the invention may be practiced. These embodiments have been described in sufficient detail to enable those skilled in the art to practice the invention, and it is to be understood that other embodiments may be utilized and that logical, mechanical and electrical changes may be made without departing from the spirit and scope of the present invention. The foregoing detailed description is, therefore, not to be taken in a limiting sense, and the scope of the present inventions is defined only by the appended claims.

Especially, the idea of the invention was described for the first portion. It should be noted that the principles described herein are also applicable for the second portion. Electronic system 50 (FIG. 3) can be, for example, a portable multi-functional computer (known as Personal Digital Assistants, PDA), a cellular phone, or an other device with crucial power consumption. Shifting circuit 30 can be implemented with the same technology as first block 10 and second block 20. Therefore, electronic system 50 can be integrated into a single integrated circuit.

We claim:

1. An apparatus receiving a first signal with a first excursion, said apparatus having a first portion and a second portion for providing a second signal responding to said first signal, said second signal having a second excursion which is greater than said first excursion, said apparatus CHARACTERIZED IN THAT said first portion has a control block which receives said first signal and transfers said first excursion into a third excursion for switching said first portion on and off, whereby said first signal toggling in a first direction switches on said first portion, and whereby said control block switches off said first portion after a time delay, said time delay beginning when said second signal has been pulled to a first reference line and ending before said second portion is switched on again, thus bringing said apparatus into a state in which said first portion and said second portion are both switched off and whereby contention is avoided when said first signal toggling in a second direction switches on said second portion.

2. The apparatus of claim 1 wherein the length of said time delay is determined by a delay block receiving said second signal.

3. The apparatus of claim 1 operating as a transfer gate wherein said second signal is logical equal to said first signal as long as a third signal supplied to apparatus is at a first logical state.

4. The apparatus of claim 1 wherein said control block comprises a latch block receiving a third signal, and wherein said first portion is switched off when said third signal toggles.

5. The apparatus of claim 1 wherein said control block comprises a switch-off-block which switches said first portion off when said first signal toggles back in said second direction.

6. The apparatus of claim 1 wherein said first portion comprises at least a P-channel field effect transistor for pulling an output node to a first reference line and wherein said second portion comprises at least a N-channel field effect transistor and wherein in said control block said first excursion is transferred into said third excursion which is supplied to an input of said P-channel field effect transistor only by additional N-channel field effect transistors but not by additional P-channel field effect transistors.

7. An apparatus receiving a first signal and providing a second signal responsive to said first signal, whereby the excursion of said first signal is amplified, said apparatus receiving a third signal arriving after said first signal, said apparatus CHARACTERIZED IN THAT a first signal level of said second signal is provided by a first transistor of a first type which is switched on by a first intermediate signal which is derived from a first serial arrangement of a first transistor of a second opposite type receiving said first signal and of a second transistor of said second type receiving said third signal;

a second signal level of said second signal is provided by a second serial arrangement of a third transistor of said second type receiving an inverted form of said first signal and a fourth transistor of said second type receiving said third signal; and said first serial arrangement is coupled to an input of said first transistor of said first type without an intervening transistor of said first type.

8. The apparatus of claim 7 wherein said transistors of said first type are P-channel field effect transistors and said transistors of said second type are N-channel field effect transistors.

9. The apparatus of claim 7 wherein a latch block is coupled to the gate of said first transistor of said first type which keeps said first transistor of said first type switched on and switches said transistor of said first type off when said second signal toggles back.

10. The apparatus of claim 7 wherein a switch-off block is coupled to the gate of said first transistor of said first type which switches said first transistor of said first type off when said first signal toggles back.

11. An apparatus comprising a first transistor of a first type and a first transistor of a second type for amplifying a first signal having a first excursion to a second signal having a second excursion, said apparatus CHARACTERIZED IN THAT said first transistor of said first type and said first transistor of said second type are coupled serially between a first reference line and a second reference line via an output node carrying said second signal, that said first excursion of said first signal is sufficient to switch said first transistor of said second type on and off and sufficient to switch said first transistor of said first type on but not off, that said first signal is received and transferred to an input of said first transistor of said first type by at least a third transistor of said second type but not of said first type, and that a fourth transistor controlled from said output node provides an intermediate signal which switches said first transistor of said first type off a first delay time after said first transistor of said first type has been switched on.

12. The apparatus of claim 11 wherein said fourth transistor is a transistor of said first type.

13. The apparatus of claim 11 wherein said fourth transistor has a gate coupled to said output node and a drain coupled to a gate of said first transistor.

14. A method for amplifying a first signal to a second signal by an apparatus, wherein said first signal alternates between a first logical state and a second logical state and assumes said second logical state during a first time interval, wherein said apparatus comprises a first transistor of a first type and a first transistor of a second type for providing said second signal, said method comprising the steps of:

transmitting said first signal in said second logical state through a second transistor of said second type but not through a transistor of said first type to an input of said first transistor of said first type and thereby making said first transistor of said first type conductive;

initiating a time delay when said first transistor of said first type becomes conductive, said time delay being determined by an inverter receiving said second signal and said time delay being shorter than said first time interval;

providing a control signal by said inverter at the end of said time delay to said first transistor of said first type and making said first transistor of said first type nonconductive; and making said first transistor of said second type conductive when said first signal assumes said first logical state, whereby said first transistor of said first type and said first transistor of said second type are non-conductive after said time delay, thus providing contention.

15. The method of claim 14 wherein in said apparatus said first transistor of said first type is a P-channel field effect transistor and said first transistor of said second type is a N-channel field effect transistor, said transistors having their drains coupled together at an output node and their sources coupled to a first reference line and to a second reference line, respectively, and wherein said inverter is coupled to said first reference line and has (i) an input coupled to said output node for receiving said second signal to initiate said time delay and (ii) an output coupled to a gate of a second transistor of said first type, said second transistor of said second type connecting a gate of said first transistor of said first type to said first reference line at the end of said time delay so that said first transistor of said first type is switched off completely.

16. The method of claim 14 wherein in said step of transmitting said first signal said first transistor of said first type becomes completely conductive so that said second signal goes to a first signal level which is substantially equal to that of a first reference line to which an electrode of said first transistor of said first type is connected to.

17. A circuit receiving an input signal and providing an output signal, said circuit comprising:

a first switch coupled between a first reference line and an output node, said first switch controlled by said input signal and when conductive providing said output signal in a first state by pulling said output node to said first reference line;

a second switch coupled between said output node and a second reference line, said second switch controlled by said input signal and when conductive providing said output signal in a second state by pulling said output node to said second reference line; and a feedback unit coupled to said output node, said feedback unit providing a control signal to said first switch which makes said first switch non-conductive a time delay after said first switch has been conductive so that when said input signal makes said second switch conductive, said first switch is already non-conductive.

\* \* \* \* \*